United States Patent [19]
Dabral et al.

[11] Patent Number: 6,090,650
[45] Date of Patent: Jul. 18, 2000

[54] METHOD TO REDUCE TIMING SKEWS IN I/O CIRCUITS AND CLOCK DRIVERS CAUSED BY FABRICATION PROCESS TOLERANCES

[75] Inventors: Sanjay Dabral, Milpitas; Krishna Seshan, San Jose, both of Calif.

[73] Assignee: Intel Corporation, Santa Clara, Calif.

[21] Appl. No.: 08/940,303

[22] Filed: Sep. 30, 1997

[51] Int. Cl.$^7$ ............................................. H01L 21/337
[52] U.S. Cl. .................... 438/195; 438/283; 438/279; 438/585
[58] Field of Search .................... 438/157, 176, 438/193, 195, 283, 284, 279, 294, 585

[56] References Cited

U.S. PATENT DOCUMENTS

| | | | |
|---|---|---|---|
| 3,967,988 | 7/1976 | Davidsohn | 438/279 |
| 4,635,088 | 1/1987 | Eguhi | 257/365 |
| 5,060,037 | 10/1991 | Rountree | 257/357 |
| 5,646,546 | 7/1997 | Bertolet et al. | 326/39 |

OTHER PUBLICATIONS

Pucknell, D.A., Eshraghian, Kamran; Basic VLSI Design Third Edition; Prentice Hall, Sydney, Austrailia, pp. 176–179, Jan. 1994.

*Primary Examiner*—John F. Niebling
*Assistant Examiner*—Christopher Lattin
*Attorney, Agent, or Firm*—Blakley, Sokoloff, Taylor & Zafman LLP

[57] ABSTRACT

A method of reducing random, processing-induced timing variations in a field effect transistor device includes providing a semiconductor substrate having an active area, and forming a transistor having a gate over a portion of the active area, the gate having a first leg and a second leg. In a further aspect, a method of improving the timing skew of critically-matched circuits is presented. In a still further aspect of the invention, a field effect transistor and an integrated circuit device that can be used to improve timing robustness in the presence of random fabrication- or process-induced variations are presented.

4 Claims, 5 Drawing Sheets

DATA                STROBE

METHOD TO REDUCE TIMING SKEWS IN I/O CIRCUITS AND CLOCK DRIVERS CAUSED BY FABRICATION PROCESS TOLERANCES

BACKGROUND OF THE INVENTION

1. Field of the Invention

The invention relates to integrated circuit devices and more particularly to reducing timing variations due to the fabrication and operation of such devices.

2. Description of Related Art

A major goal of metal oxide semiconductor field effect transistor (MOSFET) fabrication is to increase the density and consequently speed of the integrated circuits in which such devices are utilized. To gain performance increases, the saturation drain current ($I_{Dsat}$) is increased typically by a decrease in the channel length and a decrease in the gate oxide thickness.

Integrated circuit chips or dies may have millions of devices. To fabricate such chips usually begins by computer-aided design (CAD) systems. CAD systems assemble the individual components into circuit layout patterns and draw a composite picture of the circuit surface showing all of the sub-layer patterns. This information is typically transferred to a reticle that is a hard copy of the individual drawing that may be used to pattern a wafer surface.

Patterning the wafer surface involves various steps of deposition, diffusion, etching, implantation, lithography, etc. There are probabilistic components in each of the physical formation steps of a die. For instance, though the CAD design may call for a particular gate length L, the effective gate length ($L_{eff}$) which may be deposited and patterned by deposition, diffusion, and etching steps to coincide slightly differently than the desired L. Thus, a fabrication process ideally targeted for typical process parameters will have inherent variations that either speed up or slow down the device because of the variations in the fabrication of the devices. The variations can be classified as either systematic or random. In the ordinary case, these various physical process steps in the formation of the integrated circuit die create a systematic and random "skew" in the sense that circuit speed of the die is slower because, once fabricated, individual threshold voltages of the device were slightly higher than desired or the effective gate length of the individual devices of the integrated circuit was slightly larger than desired.

In addition to the systematic and random variations in individual device level performance caused by the fabrication of such devices of an integrated circuit, there are further systematic variations presented because of the die environment. In other words, the environment around a particular device has a significant effect on the performance of that device. For example, tightly spaced gates may interact with one another or the middle gate of an array of three adjacent gates may act differently, although drawn and fabricated identically to its adjacent gates, based on the environmental effects those adjacent gates have on that device.

Further, trends in integrated circuit fabrication call for increases in die sizes to accommodate faster processing speeds. As such, devices on a larger die will encompass a larger area. Integral devices on a smaller die might be closer together than the same devices would be on a larger die. The change in environmental effects due to die size on smaller dies is less than the change in environmental effects on a larger die. Thus, increasing die size will also tend to increase the systematic and random variations inherent in a device and will have greater effects on the overall timing budget of a die.

Thus, it is known to those studied in the art that there are systematic and random errors in layout. Techniques for compensating for the systematic errors have been devised. These techniques include layout compensation, compensation of dimension, and redrawing certain legs of the circuit either at the transistor or metal layout level. More specifically, these methods include analog current matching, centroid or x-layouts, and interpolation compensation schemes. These efforts have all been targeted at reducing systematic skews in devices that reduce timing margins and switching frequency.

As dies get larger, as critical dimensions decrease to the deep submicron level, as speeds increase, the systematic and random variations become a more significant part of the timing budget. To date, the majority of efforts to address the variations in chip fabrication have been directed at the systematic variations, to the exclusion of the random process variations.

SUMMARY OF THE INVENTION

A method of reducing random, processing-induced timing variations in a field effect transistor device is disclosed. The method includes providing a semiconductor substrate having an active area, and forming a transistor having a gate over a portion of the active area, the gate having a first leg and a second leg. In a further aspect of the invention, a field effect transistor and an integrated circuit device are disclosed.

In a further aspect of the invention, a method of improving the timing skew of critically-matched circuits is disclosed. In a still further aspect of the invention, a field effect transistor and an integrated circuit device that can be used to improve timing robustness in the presence of random fabrication- or process-induced variations is disclosed.

Additional features and benefits of the invention will become apparent from the detailed description, figures, and claims set forth below.

DETAILED DESCRIPTION OF THE INVENTION

A method of reducing random, processing-induced timing variations in a field effect transistor device and between two or many matched circuits is disclosed. In one embodiment, the invention relates to multi-legging a large device, such as for example an I/O clock buffer, latch and buffer, etc. to reduce skew due to the process-induced random component of the $V_t$ variation and $L_{eff}$ variations. This directly benefits the timing margin or speed of a circuit. A layout strategy that takes into account the line width variations due to proximity effects in photolithography is also disclosed.

The invention and the advantages of the invention in reduction in skew due to the random component of the $V_t$ variation and $L_{eff}$ variation is described with reference to a source synchronous input/output (I/O) scheme. It is to be appreciated, however, that the methodology of the invention is also effective to reduce the random timing variations in other synchronous circuits or circuits where a phase delay is desired.

Figure 1:
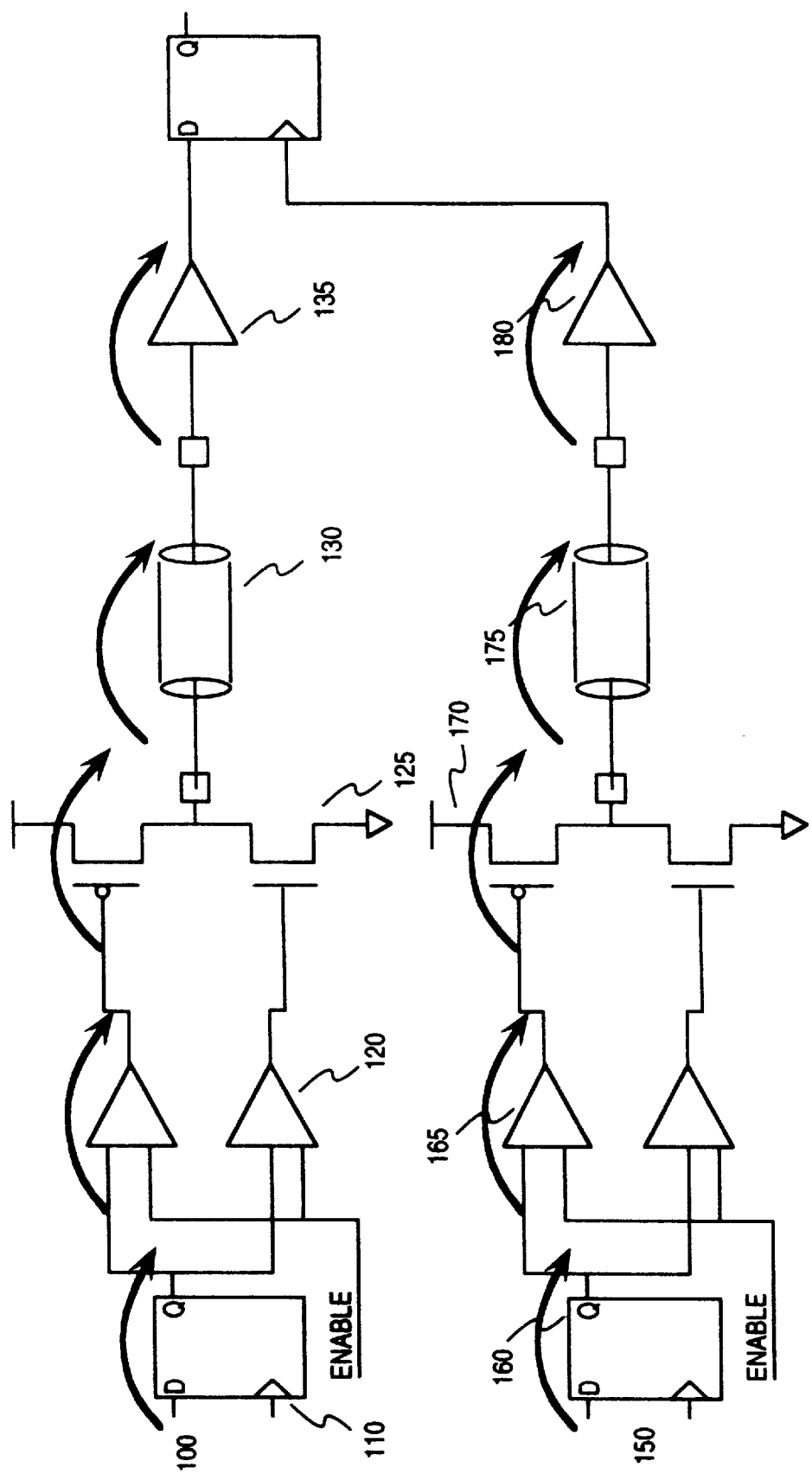
FIG. 1 is a circuit diagram of a source synchronous path where matching of data and strobe timing is very important.

An example of the significance of random variations will be explained with reference to the source synchronous I/O scheme presented in FIG. 1. A source synchronous I/O scheme works on the premise that the timing between a data 100 and its latching strobe 150 should be maintained accurately over the entire path that consists of the driver, the transmission line, and the receiver circuits. In FIG. 1, the data device consists of a latch 110, a driver made up of a pre-driver 120 and an output driver 125, transmission line 130, and receiver 135. Similarly, the strobe consists of the latch 160, a driver of a pre-driver 165 and an output driver 170, a transmission line 175 and a receiver 180. The better the timing can be preserved between the data and the strobe, the better the margin and bus performance. Any skews between data and strobe timing directly reduce the I/O throughput.

In general, the circuit timing is related to the $L_{eff}$ and threshold voltage $(V_t)$ variations through the MOSFET current. In simplistic form, the MOSFET current can be represented as:

$$I_{ds} = K \frac{W}{L_{eff}} (Vgs - V_t)^2$$

Small changes in gate length, $L_{eff}$, and threshold voltage $V_t$, affect the current, which in turn affects the timing. Experimental data has indicated a mean and standard deviation to be expected for $L_{eff}$ and $V_t$ values. Therefore, both the $L_{eff}$ and $V_t$ variations can be mapped into an effective mean value with a standard deviation in terms of time. A single transistor leg, for example, can have variations with a standard deviation of σ. To cover, for example, 99.99% of products, a $L_{eff} \pm 6\sigma_{leff}$ (or $V_t + 6\sigma_{Vt}$) variation is considered. If all the data driver buffers skewed one way (i.e., +6σ) and the strobe driver buffer skewed the other way (i.e., -6σ), a worst case skew between data and strobe is obtained. Thus, for certain products, the combined effect of $V_t$, $L_{eff}$, power supply voltage variations, and other variations can be estimated as, for example, a 200 picoseconds (psec.) variation in the clock to output timing for the I/O driver. For a window of 2 nanoseconds (ns), this example is approximately 10% of the timing budget. Similarly, at the input, one product budgets a skew of, for example, approximately 100 psec. which is 5% of the timing budget. For a 1 ns window, similar skews cost approximately 30% of the timing budget. The skew is graphically illustrated in FIG. 1 by the curved arrows over each component of the data and strobe.

The above example can be extended to on-chip operations, such as clock distribution. The variations in different branches of a clock tree directly reduce the timing budget allowed for the path between two latches. Here again, a portion of the clock skew comes from random variations in $L_{eff}$ and $V_t$.

If the variations are considered completely random, then a sum of independent random variables is given by $$Z_n = \frac{1}{n} \sum_{i=1}^{n} X_i$$

and the standard deviation by $$\sigma_z^2 = \sigma_1^2 + \sigma_2^2 + \ldots + \sigma_n^2$$

or $$\sigma_z = \sqrt{n}\sigma$$

Therefore, for n transistors of size 1/n, the standard deviation is:

$$\sigma = \frac{\sqrt{n}}{n}\sigma_1 = \frac{1}{\sqrt{n}}\sigma_1$$

where $\sigma_1$ is the standard deviation of a device with only one leg.

Figure 2:
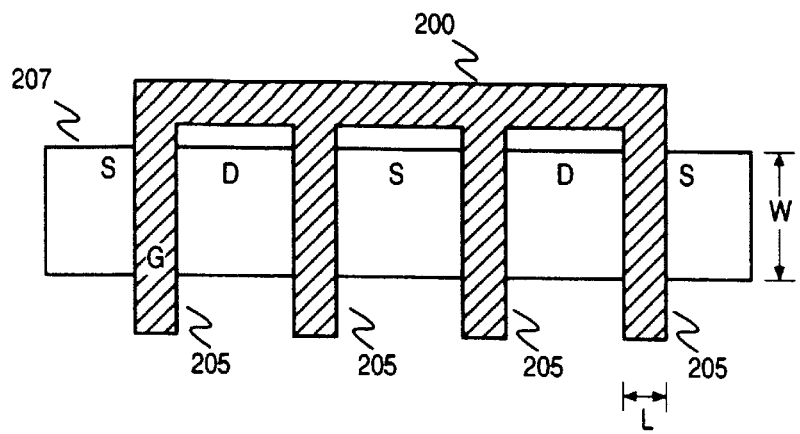
FIG. 2 is a schematic planar top view of an embodiment of the field effect transistor of the device in accordance with the invention.

Instead of the single leg above that produced a ±6σ, a multi-leg transistor may be formed as shown in FIG. 2. FIG. 2 shows a gate 200 having multiple or, in this example, four leg portions 205. Leg portions 205 are formed over diffusion regions 207. The transistor shown in FIG. 2 behaves similarly to the single leg prior art transistors. However, to obtain an effective random variation in $L_{eff}$ equivalent to $L_{eff}$-6σ in a multi-leg device, such as shown in FIG. 2, all the legs 205 will have to exhibit a -6σ variation. This is extremely improbable. To obtain the same product coverage as above (e.g., 99.99%), the $L_{eff}$ of the combined transistor may vary only $L_{eff} \pm \sigma/\sqrt{n}$. If, for example, the original skew due to random variations was 200 psec., then breaking the device into four legs (i.e., n=4 as shown in FIG. 2), the skew will be 100 psec. For a 1,000 psec. window, this represents a 10% timing margin savings.

In one embodiment, the multi-leg transistor gate is configured such that the gate width, W, scaling does not produce significant random variations, by causing, for example, significant standard deviation in $V_t$ and the effective width. To avoid the situation where the gate width, W, becomes a limiting factor in the reduction of timing skew due to random variations, the gate width should maintain the following relationship.

$$\frac{\sigma_l}{L} \gg n \times \max\left\{\left(\frac{\sigma_w}{W}\right), \left(\frac{\sigma_{vt}}{V_t(W)}\right)\right\}$$

where
$\sigma_l$=standard deviation of gate length, L
L=gate length of individual legs
$\sigma_w$=standard deviation of gate width, W W=gate width $\sigma_{vt}$=standard deviation of threshold voltage, $V_t$ $V_t(W)$=threshold voltage as a function of width, W n=typically between 3–20, with 10 being a desired engineering choice. By maintaining the above relationship, where $\sigma_l/L$ is more than between three and 20 times, preferably more than 10 times, the maximum of either $\sigma_w/W$ or $\sigma_{vt}/V_t(W)$, random variations of a multi-leg device due to gate width multi-leg device will not be a limiting factor.

Figure 3:
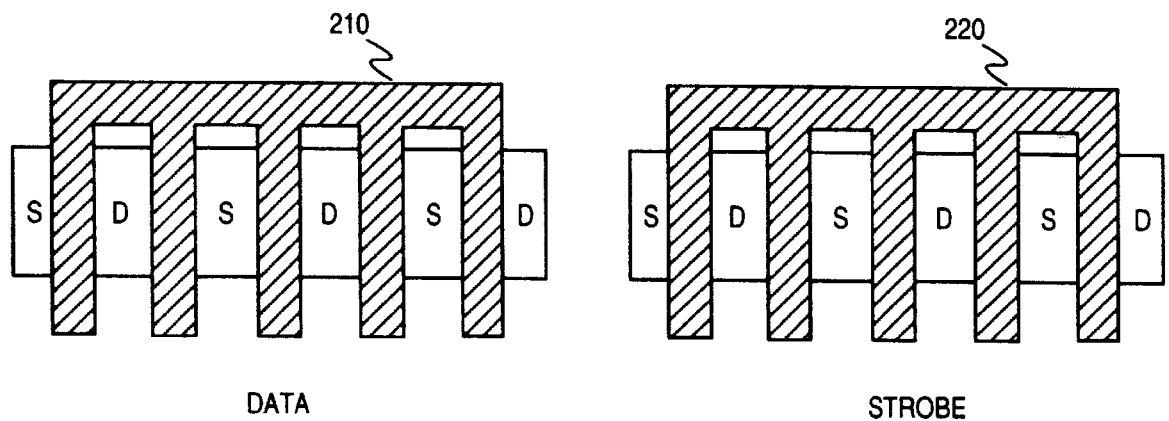
FIG. 3 is a schematic top view illustration of elements of a source synchronous I/O path in accordance with the invention.

FIG. 3 represents transistor elements 210 and 220 of the data and strobe paths of a source synchronous path, respectively. It is to be appreciated that each of the devices of the I/O scheme (e.g., latches 110 and 160, pre-drivers 120 and 165, drivers 125 and 170, transmission lines 130 and 175, input receivers 135 and 180, respectively), or devices of other timed circuits, can be formed of a multi-leg transistor as shown in FIG. 3. For single legs, the maximum skew due to $L_{eff}$ and $V_t$ are $12\sigma$. The skew for a multi-leg device is $12\sigma/\sqrt{n}$. A similar effect is recognized with $V_t$. It is to be appreciated that each element that is made up of a transistor or transistors need not be converted to a multi-leg device or devices to see a reduction in random fabrication process variations. However, each transistor device that can be replaced with a multi-leg device will contribute to a reduction in the random variations. Therefore, the devices may be configured as multi-leg transistor devices where appropriate.

Figure 4:
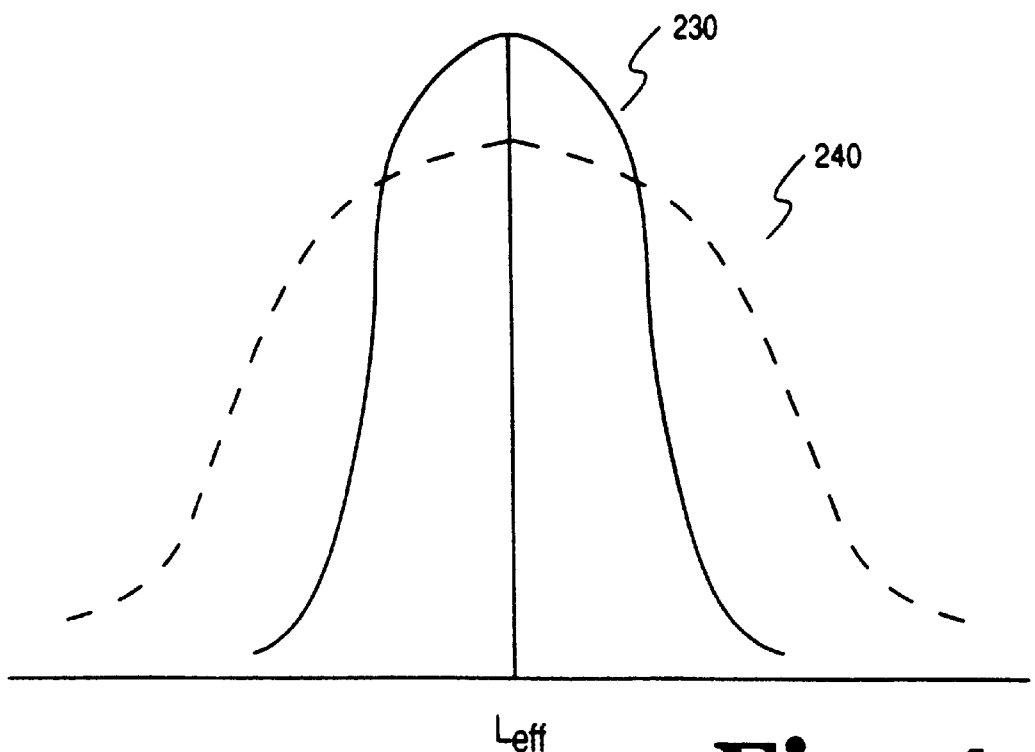
FIG. 4 is a graphical representation of the timing distribution due to gate length between a conventional transistor and a multi-leg transistor in accordance with the invention.

FIG. 4 demonstrates the effect of breaking a single transistor having a width (W) into n legs of W/n size each. In FIG. 4, the distribution represented by line 240 represents the random process variation on $L_{eff}$ for a single-legged transistor. The distribution represented by line 230 represents the random process variation on $L_{eff}$ for a multi-leg device having n legs of W/n size each. As illustrated, the $L_{eff}$ distribution is much tighter, i.e., much narrower, for a multi-leg transistor than a single leg transistor. FIG. 4 demonstrates that the random variations based on $L_{eff}$ in a multi-leg device may be greatly reduced. The same result will be achieved if $V_t$ is measured as opposed to $L_{eff}$.

Table 1 represents the effect of converting one transistor leg into multiple transistor legs. Table 1 considers a circuit with, for example, a 200 psec. skew caused by random variations of $V_t$, $L_{eff}$, and voltage and temperature variations.

TABLE 1

| Legs | Effective σ | 6 σ | Skews | Comments |
| --- | --- | --- | --- | --- |
| 1 | 0.006 | 0.036 | 200 ps Baseline | Prior art case with 200 psec. selected as a baseline example |
| 2 | 0.0042 | 0.0255 | 142 ps | 30% benefit in timing budget for random variations |
| 4 | 0.003 | 0.018 | 100 ps | 50% benefit benefit in timing budget for random variations |
| 8 | 0.0021 | 0.0127 | 71 ps | 65% benefit benefit in timing budget for random variations |
| 16 | 0.0015 | 0.009 | 50 ps | 75% benefit benefit in timing budget for random variations |

Table 1 shows that by converting a transistor from a single leg to a pair of legs results in a 30% benefit; 4 legs, a 50% benefit; 8 legs, a 65% benefit; and 16 legs, a 75% benefit in the timing budget allocated to random variations.

It is to be appreciated that the invention contemplates that the number of legs of a multi-leg device is limited, if at all, to maintaining the relationship of transistor leg length, L, to gate width, W (e.g., $\sigma_l/L$ is more than ten times the maximum of either $\sigma_w/W$ or $\sigma_{vt}/V_t(W)$). This is to be compared with prior art structures where a width of a transistor was determined primarily by its ability to behave like a single electrical node. Thus, the invention contemplates that the number of transistor legs be maximized to reduce timing skews due to random variations.

The multi-leg field effect transistor (FET) device provides improved timing robustness in skews in the presence of random fabrication process variations. It is to be appreciated that the benefits of multi-leg transistor devices can be used, where appropriate, in output drivers, input receivers (differential and single-ended), clock drivers, and process, voltage, and temperature compensation generation and receiving circuits. The multi-legging directly benefits the timing margin or speeds of a circuit. Further, the multi-legging can be done in addition to the other systematic variation reduction methods presented above to reduce the timing variations in integrated circuits.

Figure 5:
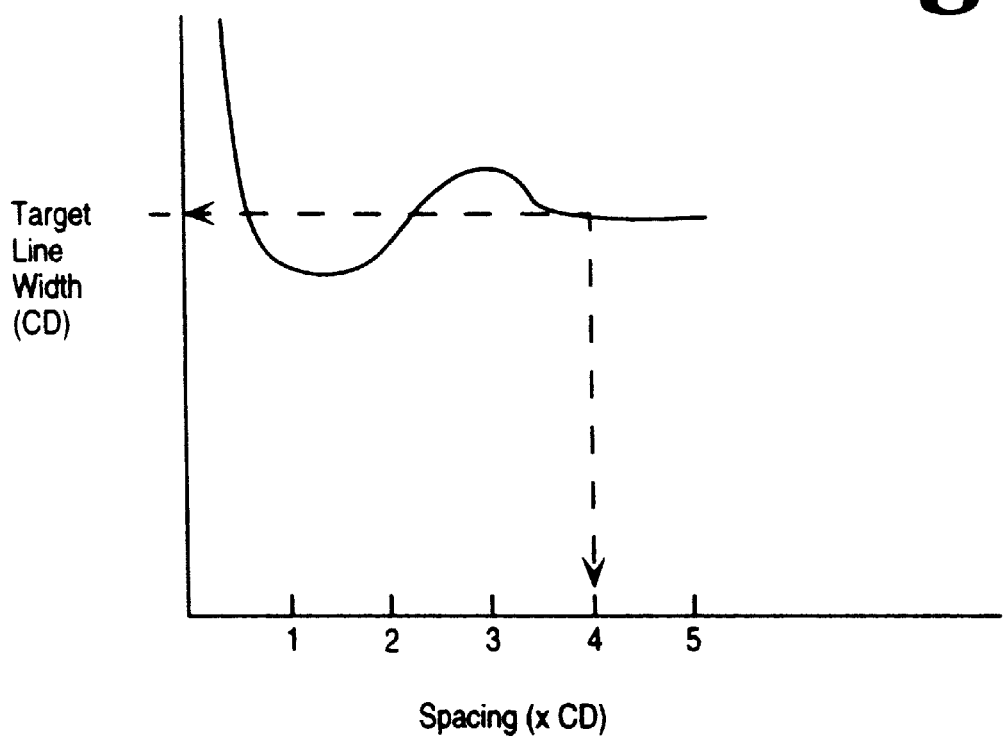
FIG. 5 is a graphical representation of patterned line width as a function of line pitch.
Figure 6:
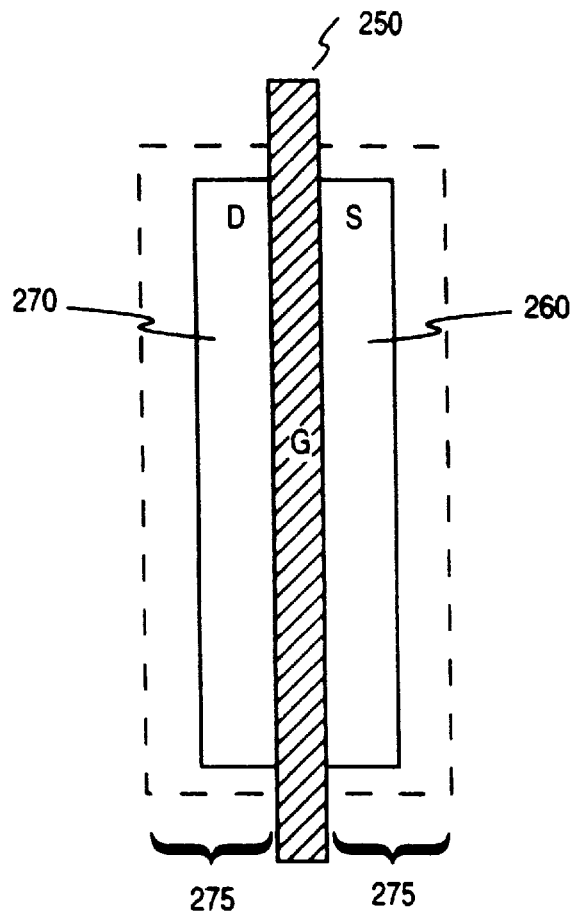
FIG. 6 is a schematic planar top view illustration of a conventional transistor illustrating the needed space between the patterned lines to minimize the effect of proximity effects on line width control.
Figure 7:
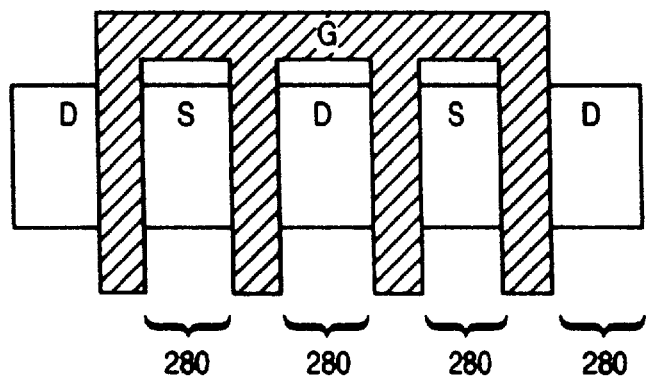
FIG. 7 is a schematic planar top view illustration of a multi-legged transistor illustrating the needed space between legs to minimize proximity effects of the operation of one leg on another.

A source of transistor gate length variation (both random and systematic) is the line proximity effect. This effect is shown graphically in FIG. 5. In FIG. 5, the gate length is shown as a function of the line pitch, where the pitch has been expressed in terms of the target critical dimension (i.e., minimum gate length) of a transistor device. Here it is seen that an experimentally determined factor of four times the critical dimension is sufficient to insure minimal proximity effect between adjacent lines. It is to be appreciated that this critical dimension spacing factor may be different in different process technologies. For purposes of this discussion, the critical dimension was determined experimentally to be four. This means that, in this example, a single line in a critically matched circuit (e.g., for minimum time skew), should have no other lines closer than four times the critical dimension. This is shown in FIG. 6, where, for example, a polysilicon transistor line 250 with adjacent source and drain regions 260 and 270, respectively, is separated from adjacent polysilicon transistor lines by a distance equivalent to four times the line width of polysilicon line 250. The distance is represented by reference numeral 275. Similarly, in a multi-leg FET device, each conductive material, e.g., polysilicon, line should be separated by a distance, represented in FIG. 7 by space 280 to encounter minimal proximity effects from other legs. The spacing requirements due to the line proximity effect and the desire to minimize time skew should not raise a large issue, since typical contact placement generally requires adjacent lines be placed at a distance of two to three times the critical dimension.

Figure 8:
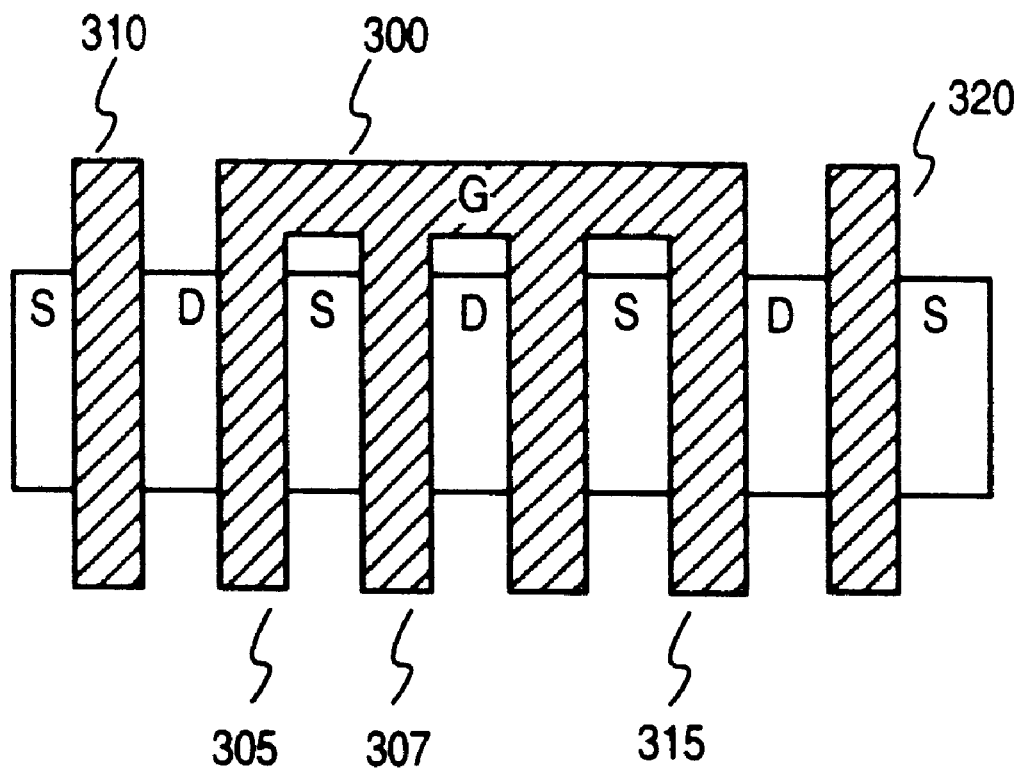
FIG. 8 is a schematic planar top view of a multi-legged transistor having legs separated by minimum width and dummy lines patterned adjacent the end legs in accordance with the invention.

In some cases, however, the minimal design rules and concerns about proximity effects must give way to concerns of potential increased drain capacitance and device area. In this situation, the target spacing, for example, four times the gate length, gives way to tighter spacing. In this instance, minimal design rules can be used with little effect on the device, provided a "dummy" line is added at the end of the device. FIG. 8 shows a multi-leg FET device 300 having a pair of dummy lines 310 and 320, respectively, at the end of the device. Dummy lines 310 and 320 ensure that active transistor 300 will see a similar pitch at each leg of the device, i.e., the pitch at a center leg is equivalent to the pitch at an outer leg. Without dummy legs 310 and 320, the end transistor legs 305 and 315, respectively, will see a different pitch than a transistor leg, for example, 307 in the center of transistor 300, resulting in a different critical dimension for the device. In the device shown in FIG. 8, dummy lines 310 and 320 are tied off so as not to be electrically active. Thus, by using dummy lines, a consistent critical dimension is achieved and the device occupies a smaller device area and will yield a lower drain capacitance.

In the preceding detailed description, the invention is described with reference to specific embodiments thereof. It will, however, be evident that various modifications and changes may be made thereto without departing from the broader spirit and scope of the invention as set forth in the claims. The specification and drawings are, accordingly, to be regarded in an illustrative rather than a restrictive sense.

What is claimed is:

1. A method comprising:

forming a first transistor device having a gate over a portion of an active area of a semiconductor substrate, the gate having a first leg and a second leg, an exterior side of the first leg adjacent a first portion of the active area;

forming a second transistor device adjacent the first portion of the active area; and electrically deactivating the second transistor device.

2. The method of claim 1, wherein a second portion of the active area is adjacent an exterior side of the second leg, the method further comprising the step of:

forming a third transistor adjacent the second portion of the active area; and electrically deactivating the third transistor.

3. A method comprising:

providing a pair of circuits between which a desired time delay is maintained, each of the pair of circuits comprised of a plurality of transistor devices;

forming at least one first transistor device for each of the pair of circuits having a gate over a portion of an active area of a semiconductor substrate, the gate having a first leg and a second leg, an exterior side of the first leg adjacent a first portion of each active area;

forming a second transistor device adjacent the first portion of each active area; and electrically deactivating the second transistor device.

4. The method of claim 3, wherein a second portion of each of the active area is adjacent an exterior side of the second leg of each of the at least one first transistor, and wherein the method further comprising the step of:

forming a third transistor device adjacent the second portion of the active area; and electrically deactivating the third transistor.

* * * * *